United States Patent
Kan

(10) Patent No.: US 11,948,713 B2
(45) Date of Patent: Apr. 2, 2024

(54) MAGNETIC COATING MATERIAL, MAGNETIC SHEET, AND METAL COMPATIBLE TAG

(71) Applicant: FUJIKURA KASEI CO., LTD., Tokyo (JP)

(72) Inventor: Takeshi Kan, Saitama (JP)

(73) Assignee: FUJIKURA KASEI CO., LTD., Tokyo (JP)

( * ) Notice: Subject to any disclaimer, the term of this patent is extended or adjusted under 35 U.S.C. 154(b) by 23 days.

(21) Appl. No.: 17/789,618

(22) PCT Filed: Nov. 6, 2020

(86) PCT No.: PCT/JP2020/041588
§ 371 (c)(1),
(2) Date: Jun. 28, 2022

(87) PCT Pub. No.: WO2021/145055
PCT Pub. Date: Jul. 22, 2021

(65) Prior Publication Data
US 2023/0039179 A1    Feb. 9, 2023

(30) Foreign Application Priority Data

Jan. 15, 2020   (JP) .................... 2020-004609

(51) Int. Cl.
*H01F 1/16* (2006.01)
*C09D 5/38* (2006.01)
(Continued)

(52) U.S. Cl.
CPC ............... *H01F 1/16* (2013.01); *C09D 5/38* (2013.01); *C09D 7/61* (2018.01); *C09D 153/025* (2013.01);
(Continued)

(58) Field of Classification Search
CPC .... H01F 1/16; C09D 5/38; C09D 7/61; C09D 153/025; C09D 175/06; C09D 7/66;
(Continued)

(56) References Cited

U.S. PATENT DOCUMENTS

| | | |
|---|---|---|
| 2010/0219252 A1 | 9/2010 | Kikuchi et al. |
| 2014/0001270 A1 | 1/2014 | Kikuchi et al. |
| 2019/0267169 A1* | 8/2019 | Sawada ............... B22F 1/00 |

FOREIGN PATENT DOCUMENTS

| | | |
|---|---|---|
| CN | 103409054 A * | 11/2013 |
| JP | 2003-142871 A | 5/2003 |

(Continued)

OTHER PUBLICATIONS

JP2010272608A Flat Soft Magnetic Powder and Magnetic Body, 6 pages. (Year: 2023).*

(Continued)

*Primary Examiner* — Tuyen K Vo
(74) *Attorney, Agent, or Firm* — Greenblum & Bernstein, P.L.C.

(57) ABSTRACT

Disclosed are a magnetic coating material, a magnetic sheet, and a metal compatible tag that have excellent magnetic shielding characteristics against radio waves in the UHF band and do not interfere with a distribution process. A magnetic coating material includes a magnetic filler and a binder resin, wherein the magnetic filler is an Fe—Cr alloy, and wherein in a magnetic sheet formed from the magnetic coating material, complex relative permeability in 860 MHz to 960 MHz has a loss factor tan δ of 0.3 or less and a real part μ' of 5 or more. Also, a magnetic coating material includes a magnetic filler and a binder resin, wherein the magnetic filler is an Fe—Cr alloy, and wherein a mass ratio (Continued)

of the magnetic filler to a solid content of the binder (mass of the magnetic filler/mass of the solid content of the binder) is from 70/30 to 95/5.

8 Claims, 1 Drawing Sheet

(51) Int. Cl.
    *C09D 7/61*       (2018.01)
    *C09D 153/02*     (2006.01)
    *C09D 175/06*     (2006.01)
    *G06K 19/07*      (2006.01)

(52) U.S. Cl.
    CPC ....... *C09D 175/06* (2013.01); *G06K 19/0723* (2013.01)

(58) Field of Classification Search
    CPC ...... C09D 5/23; C09D 163/00; C09D 167/00; C09D 201/00; G06K 19/0723; C08K 2003/0856; C08K 2201/01; C08K 2201/016; H05K 9/00
    See application file for complete search history.

(56) References Cited

FOREIGN PATENT DOCUMENTS

| | | | |
|---|---|---|---|
| JP | 2007-257614 A | | 10/2007 |
| JP | 2007-295558 A | | 11/2007 |
| JP | 2007295557 A | * | 11/2007 |
| JP | 2008-21991 A | | 1/2008 |
| JP | 2010-72957 A | | 4/2010 |
| JP | 2010-272608 A | | 12/2010 |
| JP | 2014-146698 A | | 8/2014 |
| JP | 2016-21490 A | | 2/2016 |
| JP | 2017126643 A | * | 7/2017 |
| JP | 6625435 B2 | * | 12/2019 |
| JP | 2020150036 A | * | 9/2020 |
| JP | 2020178118 A | * | 10/2020 |

OTHER PUBLICATIONS

JP2017126643A Method for Manufacturing Anisotropic Magnetic Shield Material, 6 pages. (Year: 2023).*
JP2020150036A Magnetic Paint Composition, 5 pages. (Year: 2023).*
JP2020178118A—Sheet-Like Precursor for Noise Suppressing Layer Formation, Noise Suppressing Sheet and Method for Noise Suppression, 13 pages. (Year: 2023).*
CN103409054A—A Magnetic Paint, 4 pages. (Year: 2023).*
JP2007295557A—Magnetic Shield Sheet, Method for Improving Non-Contact IC Card Transmission, and Non-Contact IC Card Hold Container, 24 pages. (Year: 2023).*
JP6625435B2—Magnetic shield laminate, 7 pages. (Year: 2023).*
ISR for PCT/JP2020/041588, dated Jan. 12, 2021 (w/ translation).
Written Opinion for PCT/JP2020/041588, dated Jan. 12, 2021 (w/ translation).

* cited by examiner

MAGNETIC COATING MATERIAL, MAGNETIC SHEET, AND METAL COMPATIBLE TAG

TECHNICAL FIELD

The present invention relates to a magnetic coating material, a magnetic sheet, and a metal compatible tag for radio waves in the UHF band.

BACKGROUND ART

In recent years, in order to improve efficiency of product manufacturing, sales, and inventory management, a method of reading product identification information written in a radio frequency identification (RFID) tag by using an RFID reader/writer (hereinafter, referred to as an "RFID scanner") has been used. In this method, since the information is transmitted and received by radio waves in the UHF band, it is possible to transmit and receive the information over a relatively long distance in a non-contact manner.

However, the RFID tag has a problem that information cannot be transmitted and received when the RFID tag is close to metal or moisture. This is considered to be due to reflection of radio waves in the UHF band by metal and absorption of radio waves in the UHF band by moisture.

In order to solve this problem, currently, when an RFID tag is attached to a metal product (e.g., confectionary in aluminum pouches) or a product containing a large amount of water (e.g., water in plastic bottles), an insulator spacer is provided between the RFID tag and the product.

However, since the insulator spacer has a thickness of several mm, there are problems that the RFID tag is bulky, the product space increases, and the appearance of the product deteriorates.

Meanwhile, there has been a magnetic shield coating material corresponding to radio waves in the HF band for a long time, and according to this, a magnetic shield material having a thickness of 200 µm can be obtained (see Patent Literature 1). Unfortunately, this magnetic shield material only supports radio waves in the HF band, and does not support radio waves in the UHF band.

CITATION LIST

Patent Literature

Patent Literature 1: JP 2016-021490 A

SUMMARY OF INVENTION

Technical Problem

An object of the present invention is to solve the above problems. Specifically, an object of the present invention is to provide a magnetic coating material, a magnetic sheet, and a metal compatible tag that have excellent magnetic shielding characteristics against radio waves in the UHF band and do not interfere with a distribution process.

Solution to Problem

According to the invention, the above objects are achieved by providing the following [1] to [9].

[1] A magnetic coating material comprising a magnetic filler and a binder resin, wherein the magnetic filler is an Fe—Cr alloy, and wherein in a magnetic sheet formed from the magnetic coating material, complex relative permeability in 860 MHz to 960 MHz has a loss factor tan δ of 0.3 or less and a real part µ' of 5 or more;

[2] A magnetic coating material comprising a magnetic filler and a binder resin, wherein the magnetic filler is an Fe—Cr alloy, and wherein a mass ratio of the magnetic filler to a solid content of the binder (mass of the magnetic filler/mass of the solid content of the binder) is from 70/30 to 95/5;

[3] The magnetic coating material according to the [1] or [2], wherein the binder resin is one or more binder resins selected from the group consisting of an epoxy resin, a urethane resin, and a polyester resin;

[4] The magnetic coating material according to the [3], wherein the epoxy resin is an epoxidized product of a styrene-butadiene block copolymer;

[5] The magnetic coating material according to any one of the [1], [3], and [4], wherein a mass ratio of the magnetic filler to a solid content of the binder (mass of the magnetic filler/mass of the solid content of the binder) is from 70/30 to 95/5;

[6] The magnetic coating material according to any one of the [1] to [5], wherein the magnetic filler has an aspect ratio of 5 to 40;

[7] A magnetic sheet formed from the magnetic coating material according to any one of the [1] to [6];

[8] The magnetic sheet according to the [7], wherein the magnetic sheet has a film thickness of 50 to 500 µm;

[9] A metal compatible tag comprising the magnetic sheet according to the [7] or [8] and a tag allowing for wireless communication.

Advantageous Effects of Invention

The invention can provide a magnetic coating material, a magnetic sheet, and a metal compatible tag that have excellent magnetic shielding characteristics against radio waves in the UHF band and do not interfere with a distribution process. In addition, since the magnetic coating material can also be used for label printing, a metal compatible tag can be easily produced.

DESCRIPTION OF EMBODIMENTS

Hereinafter, embodiments of the invention will be described with reference to the drawings and the like. The invention, however, is not limited to the following embodiments without departing from the spirit of the invention.

(Magnetic Coating Material)

First, a magnetic coating material of the invention will be described. The magnetic coating material of the invention contains at least the following magnetic filler and binder resin.

a) Magnetic Filler

The material for the magnetic filler of the invention is an Fe—Cr alloy. By using the Fe—Cr alloy magnetic filler, the magnetic sheet formed from the magnetic coating material of the invention has excellent magnetic shielding characteristics against radio waves in the UHF band.

Figure 1:
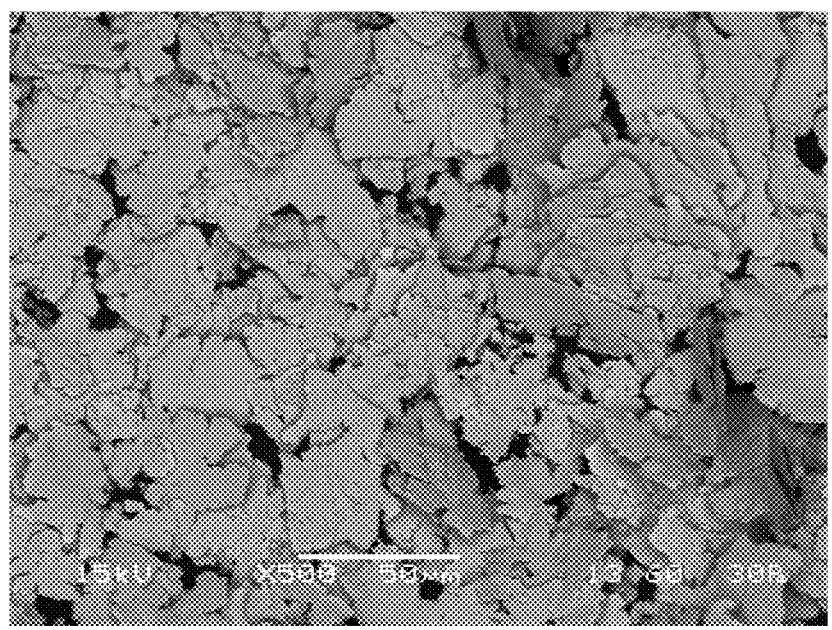
FIG. 1 is a photograph of the surface of a magnetic filler used in the invention taken with a scanning electron microscope (SEM).

FIG. 1 is a photograph of the surface of a magnetic filler in the invention taken with a scanning electron microscope (SEM). As shown in the photograph, the shape of the magnetic filler used is a flat shape or a needle shape. By using the magnetic filler having such a shape, the magnetic filler is easily oriented in the planar direction of the magnetic sheet formed from the magnetic coating material of the invention, and the magnetic sheet formed from the magnetic coating material of the invention has excellent magnetic shielding characteristics against radio waves in the UHF band. Note that the flat shape is, for example, a shape obtained by crushing a three-dimensional shape such as a spherical shape or a rectangular parallelepiped in one direction, and is a concept encompassing a shape such as a plate shape, a scale shape, or a thin film shape. The needle shape refers to an elongated shape extending linearly in one direction.

The thickness of the magnetic filler is preferably 10 μm or less, more preferably 5 μm or less, and still more preferably 3 μm or less. In addition, the thickness of the magnetic filler is preferably 0.5 μm or more, more preferably 0.7 μm or more, and still more preferably 1 μm or more. When the thickness of the magnetic filler is within the above range, the magnetic filler is easily oriented in the planar direction of the magnetic sheet formed from the magnetic coating material of the invention, and the magnetic sheet formed from the magnetic coating material of the invention has excellent magnetic shielding characteristics against radio waves in the UHF band.

In addition, the long diameter of the magnetic filler is preferably 200 μm or less, more preferably 100 μm or less, and still more preferably 50 μm or less. In addition, the long diameter of the magnetic filler is preferably 1 μm or more, more preferably 3 μm or more, and still more preferably 5 μm or more. If the long diameter of the magnetic filler is within the above range, the magnetic filler is easily oriented in the planar direction of the magnetic sheet formed from the magnetic coating material of the invention, and the magnetic sheet formed from the magnetic coating material of the invention has excellent magnetic shielding characteristics against radio waves in the UHF band.

Further, the short diameter of the magnetic filler is preferably 100 μm or less, more preferably 80 μm or less, and still more preferably 50 μm or less. In addition, the short diameter of the magnetic filler is preferably 1 μm or more, more preferably 3 μm or more, and still more preferably 5 μm or more. If the short diameter of the magnetic filler is within the above range, the magnetic filler is easily oriented in the planar direction of the magnetic sheet formed from the magnetic coating material of the invention, and the magnetic sheet formed from the magnetic coating material of the invention has excellent magnetic shielding characteristics against radio waves in the UHF band.

The aspect ratio of the magnetic filler is preferably 40 or less, more preferably 35 or less, and still more preferably 30 or less. In addition, the aspect ratio of the magnetic filler is preferably 5 or more, more preferably 10 or more, and still more preferably 15 or more. If the aspect ratio of the magnetic filler is within the above range, the magnetic filler is easily oriented in the planar direction of the magnetic sheet formed from the magnetic coating material of the invention, and the magnetic sheet formed from the magnetic coating material of the invention has excellent magnetic shielding characteristics against radio waves in the UHF band. Here, the aspect ratio refers to a value obtained by dividing the long diameter of the magnetic filler by the average thickness.

b) Binder Resin

The binder resin in the invention is one or more binder resins selected from the group consisting of an epoxy resin, a urethane resin, and a polyester resin. Among these resins, an epoxy resin is preferable, and an epoxidized product of a styrene-butadiene block copolymer is particularly preferable. By using these resins, the coating material has excellent adhesion to the coating surface. In addition, by using these resins, the magnetic sheet formed from the magnetic coating material of the invention has excellent flexibility and at the same time, excellent magnetic shielding characteristics against radio waves in the UHF band.

Each epoxy resin can be obtained, for example, by mixing a prepolymer and a curing agent. Examples of the epoxy resin include a bisphenol A type epoxy resin, a bisphenol F type epoxy resin, a bisphenol AF type epoxy resin, a naphthalene type epoxy resin, a glycidyl ester type epoxy resin, a glycidyl amine type epoxy resin, a phenol novolac type epoxy resin, an alicyclic epoxy resin having an ester skeleton, a cyclohexane type epoxy resin, a cyclohexanedimethanol type epoxy resin, a glycidylamine type epoxy resin, or an epoxy resin having a butadiene structure. Among them, an epoxy resin having a butadiene structure is preferred from the viewpoint that the magnetic filler is easily oriented in the planar direction of the magnetic sheet formed from the magnetic coating material of the invention, and that the magnetic sheet formed from the magnetic coating material of the invention is likely to have excellent magnetic shielding characteristics against radio waves in the UHF band.

The urethane resin is obtained by reacting a polyol with a polyisocyanate compound. Examples of the urethane resin include a polyether-based polyurethane, a polycarbonate-based polyurethane, or a polyester-based polyurethane.

The polyether-based polyurethane is a reaction product of a polyether polyol and a polyisocyanate compound. Examples of the polyether polyol include polyethylene glycol, polypropylene glycol, or polytetramethylene glycol.

The polycarbonate-based polyurethane is a reaction product of a polycarbonate polyol and a polyisocyanate compound. Examples of the polycarbonate polyol include a polycarbonate diol obtained by reacting a diol (e.g., ethylene glycol, propylene glycol, 1,3-propanediol, 1,4-butanediol, 1,5-pentanediol, 1,6-hexanediol, 1,9-nonanediol, neopentyl glycol) with a carbonate (e.g., dimethyl carbonate, diphenyl carbonate, ethylene carbonate, phosgene).

The polyester-based polyurethane is a reaction product of a polyester polyol and a polyisocyanate compound. Examples of the polyester polyol include those obtained by reacting a dicarboxylic acid (e.g., phthalic acid, isophthalic acid, terephthalic acid, maleic acid, fumaric acid, adipic acid, sebacic acid) with a polyhydric alcohol (e.g., ethylene glycol, propylene glycol, tetramethylene glycol, 1,4-butanediol, 1,6-hexanediol, neopentyl glycol, trimethylolpropane, pentaerythritol).

Examples of the polyisocyanate compound include hexamethylene diisocyanate, tolylene diisocyanate, isophorone diisocyanate, xylylene diisocyanate, norbornene diisocyanate, 1,3-bis(isocyanatomethyl)cyclohexane, trimers of isophorone diisocyanate, hydrogenated xylylene diisocyanate, or hydrogenated diphenylmethane diisocyanate.

c) Mass Ratio of Magnetic Filler to Solid Content of Binder

In the magnetic coating material of the invention, the mass ratio of the magnetic filler to the solid content of the binder (mass of the magnetic filler/mass of the solid content of the binder) is preferably 70/30 or more, more preferably 75/25 or more, and still more preferably 80/20 or more. In addition, the mass ratio of the magnetic filler to the solid content of the binder (mass of the magnetic filler/mass of the solid content of the binder) is preferably 95/5 or less, more preferably 90/10 or less, and still more preferably 85/15 or less. When the mass ratio of the magnetic filler to the solid content of the binder (mass of the magnetic filler/mass of the solid content of the binder) is within the above range, the magnetic coating material is excellent in handleability. When the mass ratio of the magnetic filler to the solid content of the binder (mass of the magnetic filler/mass of the solid content of the binder) is within the above range, the magnetic sheet formed from the magnetic coating material of the invention has excellent flexibility as well as excellent magnetic shielding characteristics against radio waves in the UHF band.

d) Solvent

In the magnetic coating material of the invention, an organic solvent is preferably used as the solvent. Examples of the organic solvent used include toluene, methyl ethyl ketone, isopropanol, butyl acetate, ethyl acetate, butyl cellosolve, butyl carbitol acetate, or xylene. Among them, toluene, methyl ethyl ketone, or isopropanol is preferable from the viewpoint of drying performance and coating workability.

The content of the solvent in the magnetic coating material is preferably 50 mass % or less, more preferably 45 mass % or less, and still more preferably 40 mass % or less. In addition, the content of the solvent in the magnetic coating material is preferably 5 mass % or more, more preferably 10 mass % or more, and still more preferably 15 mass % or more. When the content of the solvent in the magnetic coating material is within the above range, the magnetic coating material is excellent in handleability. In addition, if the content of the solvent in the magnetic coating material is within the above range, the magnetic sheet formed from the magnetic coating material of the invention has excellent flexibility as well as excellent magnetic shielding characteristics against radio waves in the UHF band.

e) Others

In addition to the magnetic filler, the binder resin, and the organic solvent, the magnetic coating material of the invention may also contain optional components such as a dispersant, a defoaming agent, a pigment, a filler, a UV absorber, a light stabilizer, and/or an antioxidant without departing from the spirit of the invention.

The viscosity of the magnetic coating material is preferably 500 dPa·s or less and more preferably 300 dPa·s or less. In addition, the viscosity of the magnetic coating material is preferably 1 dPa·s or more and more preferably 5 dPa·s or more. When the viscosity of the magnetic coating material is within the above range, the magnetic coating material is excellent in handleability. In addition, if the content of the solvent in the magnetic coating material is within the above range, the magnetic sheet formed from the magnetic coating material of the invention has excellent flexibility as well as excellent magnetic shielding characteristics against radio waves in the UHF band. Note that the viscosity of the magnetic coating material can be adjusted by, for example, adjusting the content of the organic solvent.

The nonvolatile content of the magnetic coating material is preferably 95 mass % or less, and more preferably 90 mass % or less based on the total amount of the coating material. In addition, the nonvolatile content of the magnetic coating material is preferably 45 mass % or more, and more preferably 50 mass % or more. When the nonvolatile content of the magnetic coating material is within the above range, the magnetic coating material is excellent in handleability. In addition, if the content of the solvent in the magnetic coating material is within the above range, the magnetic sheet formed from the magnetic coating material of the invention has excellent flexibility as well as excellent magnetic shielding characteristics against radio waves in the UHF band.

(Magnetic Sheet)

The magnetic sheet of the invention can be obtained by applying the magnetic coating material onto a support and drying the magnetic coating material. The support used for coating is not particularly limited as long as the magnetic sheet can be peeled off when the magnetic coating material is dried in a subsequent step. Examples thereof include each plastic film such as a polyester film, a polycarbonate film, a polyethylene film, or a Teflon (registered trademark) film, a siliconized release film, or a release-treated release film.

The magnetic coating material is preferably applied to the support by a known method such as a roll-to-roll method while the support is conveyed. The method of applying the magnetic coating material is not particularly limited, and it is possible to use a known method of applying a coating material onto a film-shaped support while using, for instance, a curtain coater, a gravure coater, a doctor blade, or a knife coater.

The drying method after the application of the magnetic coating material is not particularly limited. For example, a known method such as drying at room temperature or drying in a hot air drying furnace can be used. However, in order to gently orient the magnetic filler contained in the magnetic sheet, drying at a temperature gradient of 3° C./min seems to be preferable.

Figure 2:
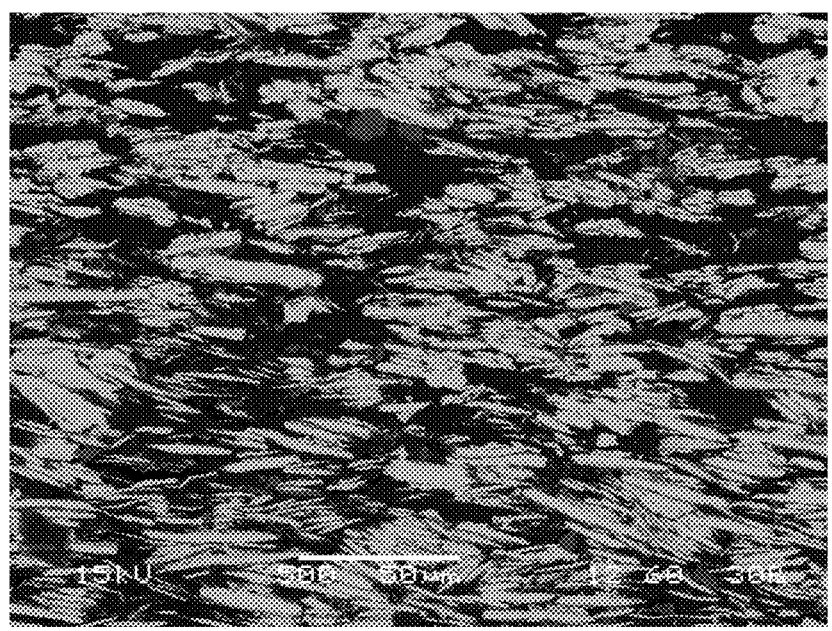
FIG. 2 is a cross-sectional photograph of a cross section of a magnetic sheet in the invention taken with a scanning electron microscope (SEM) in the film thickness direction.

FIG. 2 is a cross-sectional photograph of a cross section of a magnetic sheet in the invention taken with a scanning electron microscope (SEM) in the film thickness direction. As shown in the cross-sectional photograph, since the magnetic filler contained in the magnetic sheet is gently oriented, the magnetic sheet of the invention has excellent magnetic shielding characteristics against radio waves in the UHF band.

The magnetic coating material is preferably applied so that the dried magnetic sheet has a film thickness of 500 μm or less, and preferably 300 μm or less. In addition, the magnetic coating material is preferably applied so that the film thickness of the dried magnetic sheet is 50 μm or more, and more preferably 100 μm or more. When the film thickness of the dried magnetic sheet is within the above range, the magnetic sheet has excellent magnetic shielding characteristics against radio waves in the UHF band. In addition, when the film thickness of the dried magnetic sheet is within the above range and the magnetic sheet is attached to an RFID tag, the distribution process of the product is not hindered.

The loss factor tan δ ($\mu'/\mu''$) of the complex relative permeability, in the frequency band of 860 M to 960 MHz, of the magnetic sheet obtained from the magnetic coating material of the invention is preferably 0.3 or less, and more preferably 0.28 or less. In addition, the loss factor tan δ ($\mu'/\mu''$) of the complex relative permeability, in the frequency band of 860 M to 960 MHz, of the magnetic sheet obtained from the magnetic coating material of the invention is preferably 0.05 or more, and more preferably 0.1 or more. When the loss factor tan δ (μ'/μ") of the complex relative permeability of the magnetic sheet in the frequency band of 860 M to 960 MHz is within the above range, the magnetic sheet has excellent magnetic shielding characteristics against radio waves in the UHF band. In order to set, to within the above range, the loss factor tan δ (μ'/μ") of the complex relative permeability of the magnetic sheet in the frequency band of 860 M to 960 MHz, the material for the magnetic filler is preferably an Fe—Cr alloy. In addition, in order to set, to within the above range, the loss factor tan δ (μ'/μ") of the complex relative permeability of the magnetic sheet in the frequency band of 860 M to 960 MHz, the mass ratio of the magnetic filler to the solid content of the binder (mass of the magnetic filler/mass of the solid content of the binder) is preferably 70/30 or more, more preferably 75/25 or more, and still more preferably 80/20 or more. Further, in order to set, to within the above range, the loss factor tan δ (μ'/μ") of the complex relative permeability of the magnetic sheet in the frequency band of 860 M to 960 MHz, the mass ratio of the magnetic filler to the solid content of the binder (mass of the magnetic filler/mass of the solid content of the binder) is preferably 95/5 or less, more preferably 90/10 or less, and still more preferably 85/15 or less.

The real part μ' of the complex relative permeability, in the frequency band of 860 M to 960 MHz, of the magnetic sheet of the invention is preferably 5.0 or more, and more preferably 5.2 or more. In addition, the real part μ' of the complex relative permeability, in the frequency band of 860 M to 960 MHz, of the magnetic sheet of the invention is preferably 7.0 or less, and more preferably 6.0 or less. When the real part μ' of the complex relative permeability of the magnetic sheet in the frequency band of 860 M to 960 MHz is within the above range, the magnetic sheet has excellent magnetic shielding characteristics against radio waves in the UHF band. In order to set, to within the above range, the real part μ' of the complex relative permeability of the magnetic sheet in the frequency band of 860 M to 960 MHz, the material for the magnetic filler is preferably an Fe—Cr alloy. In addition, in order to set, to within the above range, the real part μ' of the complex relative permeability of the magnetic sheet in the frequency band of 860 M to 960 MHz, the mass ratio of the magnetic filler to the solid content of the binder (mass of the magnetic filler/mass of the solid content of the binder) is preferably 70/30 or more, more preferably 75/25 or more, and still more preferably 80/20 or more. Further, in order to set, to within the above range, the real part μ' of the complex relative permeability of the magnetic sheet in the frequency band of 860 M to 960 MHz, the mass ratio of the magnetic filler to the solid content of the binder (mass of the magnetic filler/mass of the solid content of the binder) is preferably 95/5 or less, more preferably 90/10 or less, and still more preferably 85/15 or less.

(Metal Compatible Tag)

A metal compatible tag of the invention refers to a tag in which the magnetic sheet is provided adjacent to the RFID tag. Then, the metal compatible tag of the invention is provided on a metal product such that the magnetic sheet is positioned between the RFID tag and the metal product. As a result, the RFID scanner can read information on the RFID tag. The type of the RFID tag is not particularly limited, and conventionally known RFID tags can be used. In addition, by printing the magnetic coating material on a label of a product in advance and providing an RFID tag thereon, an RFID scanner can read information on the RFID tag.

EXAMPLES

Hereinafter, the invention will be described in more detail with reference to Examples and the like, but the invention is not at all limited by these Examples.

The complex relative permeability of each of the magnetic sheets obtained in Examples 1 to 9 and Comparative Examples 1 to 4 was measured by the method below. An experiment of reading a metal compatible tag was conducted and evaluated for the metal compatible tag obtained in each of Examples 1 to 9 and Comparative Examples 1 to 4 by using the procedure below.

(Method of Measuring Complex Relative Permeability)

An RF impedance material analyzer (E-4991A, manufactured by Agilent Technologies, Inc.) was used for each magnetic sheet to measure the real part μ', the imaginary part μ", and the loss factor tan δ (μ'/μ") of the complex relative permeability in a frequency band of 1 MHz to 1 GHz.

(Evaluation Experiment of Reading Metal Compatible Tag)

A metal compatible tag was placed on a stainless steel piece (made of SUS304) such that each magnetic sheet was positioned between an RFID tag and the stainless steel piece (made of SUS304). Then, it was checked whether or not the RFID tag information in the metal compatible tag was able to be read from a position 0.5 m away by using an RFID scanner. The distance between the RFID scanner and the metal compatible tag was increased to 3.5 m, and the maximum value for the distance at which the RFID tag information in the metal compatible tag was able to be read was recorded as the evaluation result of reading the metal compatible tag. However, when it was impossible to read the RFID tag information in the metal compatible tag from a position 0.5 m away, the evaluation result of reading the metal compatible tag was set to 0 m.

Example 1

A magnetic coating material was obtained by mixing 85.0 parts by mass of an Fe—Cr alloy ("FKTE231", manufactured by SANYO SPECIAL STEEL Co., Ltd.) as a magnetic filler, 4.5 parts by mass of an epoxidized product of a styrene-butadiene block copolymer ("EPOFRIEND AT501", manufactured by Daicel Corporation) as a binder resin, 10.2 parts by mass of toluene as an organic solvent, 0.2 parts by mass of a phosphoric acid polyester-based dispersant ("BYK-111" manufactured by BYK Japan KK) as a dispersant, and 0.1 parts by mass of a non-silicone defoaming agent ("BYK-1752" manufactured by BYK Japan KK) as a defoaming agent.

The resulting magnetic coating material was applied onto a Teflon (registered trademark) sheet by a doctor blade method and dried at 60° C. for 30 min to obtain a magnetic sheet. The obtained magnetic sheet had a film thickness of 200 μm.

The obtained magnetic sheet was attached to the back surface of an RFID tag ("ALN-9835", manufactured by Alien Technology Corporation) by using a double-sided tape to produce a metal compatible tag.

The complex relative permeability of the obtained magnetic sheet and the evaluation results of reading the obtained metal compatible tag are shown in Table 1.

Example 2

A magnetic coating material was obtained by mixing 55.2 parts by mass of an Fe—Cr alloy ("FKTE231", manufactured by SANYO SPECIAL STEEL Co., Ltd.) as a magnetic filler, 9.9 parts by mass of an epoxidized product of a styrene-butadiene block copolymer ("EPOFRIEND AT501", manufactured by Daicel Corporation) as a binder resin, 22.6 parts by mass of toluene as an organic solvent, 0.4 parts by mass of a phosphoric acid polyester-based dispersant ("BYK-111" manufactured by BYK Japan KK) as a dispersant, and 0.2 parts by mass of a non-silicone defoaming agent ("BYK-1752" manufactured by BYK Japan KK) as a defoaming agent.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Example 3

A magnetic coating material was obtained by mixing 41.1 parts by mass of an Fe—Cr alloy ("FKTE231", manufactured by SANYO SPECIAL STEEL Co., Ltd.) as a magnetic filler, 17.6 parts by mass of an epoxidized product of a styrene-butadiene block copolymer ("EPOFRIEND AT501", manufactured by Daicel Corporation) as a binder resin, 40.2 parts by mass of toluene as an organic solvent, 0.8 parts by mass of a phosphoric acid polyester-based dispersant ("BYK-111" manufactured by BYK Japan KK) as a dispersant, and 0.4 parts by mass of a non-silicone defoaming agent ("BYK-1752" manufactured by BYK Japan KK) as a defoaming agent.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Example 4

A magnetic coating material was obtained in the same manner as in Example 1, except that an epoxidized product of a styrene-butadiene block copolymer, "EPOFRIEND CT310" manufactured by Daicel Corporation was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Example 5

A magnetic coating material was obtained in the same manner as in Example 2, except that an epoxidized product of a styrene-butadiene block copolymer, "EPOFRIEND CT310" manufactured by Daicel Corporation was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Example 6

A magnetic coating material was obtained in the same manner as in Example 3, except that an epoxidized product of a styrene-butadiene block copolymer, "EPOFRIEND CT310" manufactured by Daicel Corporation was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Example 7

A magnetic coating material was obtained in the same manner as in Example 1, except that a polyester-based polyurethane ("UREARNO 2456", manufactured by Arakawa Chemical Industries, Ltd.; with a weight average molecular weight of 30000) was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Example 8

A magnetic coating material was obtained in the same manner as in Example 2, except that a polyester-based polyurethane ("UREARNO 2456", manufactured by Arakawa Chemical Industries, Ltd.; with a weight average molecular weight of 30000) was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Example 9

A magnetic coating material was obtained in the same manner as in Example 3, except that a polyester-based polyurethane ("UREARNO 2456", manufactured by Arakawa Chemical Industries, Ltd.; with a weight average molecular weight of 30000) was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Comparative Example 1

A magnetic coating material was obtained by mixing 38.3 parts by mass of sendust ("FME3D-AH", manufactured by SANYO SPECIAL STEEL Co., Ltd.) as a magnetic filler, 23.0 parts by mass of a polyester-based polyurethane ("UREARNO 2456", manufactured by Arakawa Chemical Industries, Ltd.; with a weight average molecular weight of 30000) as a binder resin, 38.3 parts by mass of toluene as an organic solvent, 0.3 parts by mass of a phosphoric acid polyester-based dispersant ("BYK-111" manufactured by BYK Japan KK) as a dispersant, and 0.2 parts by mass of a non-silicone defoaming agent ("BYK-1752" manufactured by BYK Japan KK) as a defoaming agent.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Comparative Example 2

A magnetic coating material was obtained by mixing 30.9 parts by mass of an Fe—Cr alloy ("FKTE231", manufactured by SANYO SPECIAL STEEL Co., Ltd.) as a magnetic filler, 20.6 parts by mass of an epoxidized product of a styrene-butadiene block copolymer ("EPOFRIEND AT501", manufactured by Daicel Corporation) as a binder resin, 47.1 parts by mass of toluene as an organic solvent, 0.9 parts by mass of a phosphoric acid polyester-based dispersant ("BYK-111" manufactured by BYK Japan KK) as a dispersant, and 0.5 parts by mass of a non-silicone defoaming agent ("BYK-1752" manufactured by BYK Japan KK) as a defoaming agent.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Comparative Example 3

A magnetic coating material was obtained in the same manner as in Comparative Example 2, except that an epoxidized product of a styrene-butadiene block copolymer, "EPOFRIEND CT310" manufactured by Daicel Corporation was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

Comparative Example 4

A magnetic coating material was obtained in the same manner as in Comparative Example 2, except that a polyester-based polyurethane "UREARNO 2456", manufactured by Arakawa Chemical Industries, Ltd., (weight average molecular weight: 30000) was used as the binder resin.

Using the obtained magnetic coating material, a magnetic sheet and a metal compatible tag were obtained in the same manner as in Example 1. The complex relative permeability of the obtained magnetic sheet and the evaluation results of reading the obtained metal compatible tag are shown in Table 1.

TABLE 1

|  | Example 1 | Example 2 | Example 3 | Example 4 | Example 5 | Example 6 | Example 7 |
|---|---|---|---|---|---|---|---|
| Fe-Cr alloy Sendust | 85.0 | 55.2 | 41.1 | 85.0 | 55.2 | 41.1 | 85.0 |
| EPOFRIEND AT501 | 4.5 | 9.9 | 17.6 |  |  |  |  |
| EPOFRIEND CT310 |  |  |  | 4.5 | 9.9 | 17.6 |  |
| UREARNO 2456 |  |  |  |  |  |  | 4.5 |
| Toluene | 10.2 | 22.6 | 40.2 | 10.2 | 22.6 | 40.2 | 10.2 |
| Dispersant | 0.2 | 0.4 | 0.8 | 0.2 | 0.4 | 0.8 | 0.2 |
| Defoaming agent | 0.1 | 0.2 | 0.4 | 0.1 | 0.2 | 0.4 | 0.1 |
| $\mu'$ (860 MHz) | 5.25 | 5.31 | 5.24 | 5.71 | 5.25 | 5.41 | 5.23 |
| $\mu'$ (960 MHz) | 5.16 | 5.30 | 5.16 | 5.56 | 5.17 | 5.42 | 5.13 |
| $\mu''$ (860 MHz) | 1.41 | 1.38 | 1.00 | 1.31 | 1.56 | 0.97 | 1.26 |
| $\mu''$ (960 MHz) | 1.44 | 1.32 | 1.24 | 1.33 | 1.63 | 1.25 | 1.23 |
| tan δ (860 MHz) | 0.27 | 0.26 | 0.19 | 0.23 | 0.28 | 0.18 | 0.24 |
| tan δ (960 MHz) | 0.28 | 0.25 | 0.24 | 0.24 | 0.29 | 0.23 | 0.24 |
| Reading evaluation result | 3.5m | 3.5m | 3.5m | 3.5m | 3.5m | 3.5m | 3.5m |

|  | Example 8 | Example 9 | Comparative Example 1 | Comparative Example 2 | Comparative Example 3 | Comparative Example 4 |
|---|---|---|---|---|---|---|
| Fe-Cr alloy Sendust | 55.2 | 41.1 | 38.3 | 30.9 | 30.9 | 30.9 |
| EPOFRIEND AT501 |  |  |  | 20.6 |  |  |
| EPOFRIEND CT310 |  |  |  |  | 20.6 |  |
| UREARNO 2456 | 9.9 | 17.6 | 23.0 |  |  | 20.6 |
| Toluene | 22.6 | 40.2 | 38.3 | 47.1 | 47.1 | 47.1 |
| Dispersant | 0.4 | 0.8 | 0.3 | 0.9 | 0.9 | 0.9 |
| Defoaming agent | 0.2 | 0.4 | 0.2 | 0.5 | 0.5 | 0.5 |
| $\mu'$ (860 MHz) | 5.13 | 5.69 | 7.98 | 4.68 | 4.44 | 4.65 |
| $\mu'$ (960 MHz) | 5.01 | 5.55 | 7.13 | 4.55 | 4.51 | 4.66 |
| $\mu''$ (860 MHz) | 1.29 | 0.80 | 14.64 | 0.90 | 1.15 | 1.00 |
| $\mu''$ (960 MHz) | 1.26 | 1.28 | 13.62 | 1.05 | 1.19 | 1.15 |
| tan δ (860 MHz) | 0.25 | 0.14 | 1.83 | 0.19 | 0.26 | 0.22 |
| tan δ (960 MHz) | 0.25 | 0.23 | 1.91 | 0.23 | 0.26 | 0.25 |
| Reading evaluation result | 3.5m | 3.5m | 0m | 0.5m | 0.5m | 0.5m |

The invention claimed is:

1. A magnetic coating material comprising a magnetic filler and a binder resin, wherein
the magnetic filler is an Fe—Cr alloy, and
wherein in a magnetic sheet formed from the magnetic coating material, complex relative permeability in 860 MHz to 960 MHz has a loss factor tan δ of 0.3 or less and a real part μ' of 5 or more.

2. The magnetic coating material according to claim 1, wherein the binder resin is one or more binder resins selected from the group consisting of an epoxy resin, a urethane resin, and a polyester resin.

3. The magnetic coating material according to claim 2, wherein the binder resin comprises an epoxidized product of a styrene-butadiene block copolymer.

4. The magnetic coating material according to claim 1, wherein a mass ratio of the magnetic filler to a solid content of the binder (mass of the magnetic filler/mass of the solid content of the binder) is from 70/30 to 95/5.

5. The magnetic coating material according to claim 1, wherein the magnetic filler has an aspect ratio of 5 to 40.

6. A magnetic sheet formed from the magnetic coating material according to claim 1.

7. The magnetic sheet according to claim 6, wherein the magnetic sheet has a film thickness of 50 to 500 μm.

8. A metal compatible tag comprising the magnetic sheet according to claim 6 and a tag allowing for wireless communication.

\* \* \* \* \*